(12) United States Patent
Steger et al.

(10) Patent No.: US 7,948,007 B2
(45) Date of Patent: May 24, 2011

(54) POWER SEMICONDUCTOR MODULE WITH FLUSH TERMINAL ELEMENTS

(75) Inventors: Jürgen Steger, Hiltpoltstein (DE); Yvonne Manz, Weisendorf (DE)

(73) Assignee: Semikron Elecktronik GmbH & Co. KG, Nuremberg (DE)

( * ) Notice: Subject to any disclaimer, the term of this patent is extended or adjusted under 35 U.S.C. 154(b) by 645 days.

(21) Appl. No.: 11/403,169

(22) Filed: Apr. 12, 2006

(65) Prior Publication Data
US 2007/0235860 A1    Oct. 11, 2007

(30) Foreign Application Priority Data

Apr. 12, 2005   (DE) .......................... 10 2005 016 650

(51) Int. Cl.
*H01L 23/02* (2006.01)
(52) U.S. Cl. .......................... 257/181; 257/688; 257/785
(58) Field of Classification Search .................. 257/181, 257/688, 785
See application file for complete search history.

(56) References Cited

U.S. PATENT DOCUMENTS

| 6,365,965 B1 * | 4/2002 | Jeun | 257/723 |
| 2004/0159940 A1 * | 8/2004 | Hiyoshi | 257/732 |

FOREIGN PATENT DOCUMENTS

| DE | 3937045 | 5/1991 |
| DE | 197 52 408 A1 | 6/1998 |
| DE | 102 58 565 B3 | 8/2004 |
| DE | 102004019568 | 11/2005 |
| EP | 0 527 033 A2 | 2/1993 |
| EP | 1 009 026 A2 | 12/1999 |
| EP | 1 713 124 A3 | 4/2006 |
| EP | 1 713 124 B1 | 12/2009 |

OTHER PUBLICATIONS

German Office Action dated Nov. 5, 2009, Pat. No. 06007011.7, 15 pages.
German bibliography, Pat. Serial No. G 91 09 294.9 dated Dec. 12, 1991, 1 page.
German Office Action dated Jan. 16, 2006, 4 pages.
German Office Action dated Sept. 16, 2006, 5 pages.
German Office Action Response dated May 18, 2009, 9 pages.
German Office Action Response, 16 pages.

* cited by examiner

*Primary Examiner* — Phat X Cao
(74) *Attorney, Agent, or Firm* — Lackenbach Siegel, LLP; Andrew F. Young, Esq.

(57) ABSTRACT

A power semiconductor module includes a housing, terminal elements leading to the outside of the housing, an electrically insulated substrate arranged inside the housing, with the substrate being comprised of an insulating body and having on the first main face facing away from the base plate a plurality of connecting tracks electrically insulated from each other. The terminal and connecting elements are arranged on a connecting track in with contact faces contacting connecting tracks or power semiconductor components, with the individual contact faces having a plurality of partial contact faces. In one optional embodiment, each partial contact face has a maximum area of 20 mm$^2$. In another embodiment, partial contact faces each are arranged at a distance of approximately 5 mm with regard to each other and the connection of the partial faces to the connecting tracks or the power semiconductor components is flush.

5 Claims, 3 Drawing Sheets

US 7,948,007 B2

POWER SEMICONDUCTOR MODULE WITH FLUSH TERMINAL ELEMENTS

CROSS REFERENCE TO RELATED APPLICATIONS

This application claims priority from German Patent Application No. DE 10 2005 016 650.4, filed Apr. 12, 2005, the entire contents of which is herein fully incorporated by reference.

FIGURE SELECTED FOR PUBLICATION

FIG. 3

BACKGROUND OF THE INVENTION

1. Field of the Invention

The present invention relates to a power semiconductor module with a housing, at least one electrically insulating substrate, and flush-contact type terminal elements having an improved service life. More specifically, the present invention relates to a power semiconductor module. Terminal elements enable an external load or auxiliary contact and include at least one discontinuous contact surface capable of distributing operational strain and stress thereby minimizing element failure.

2. Description of the Related Art

The present invention relates to power semiconductor modules comprised of a housing with base plate, or adapted for mounting on a heat sink, and at least one electrically insulating substrate arranged therein. The substrate is comprised of an insulating body and a plurality of metal connecting tracks, electrically insulated from each other, with the power semiconductor components being located on the connecting tracks and connected to these connecting tracks via appropriate circuitry. On the substrate's lower face it advantageously has a metal layer, comparable to the connecting tracks. Furthermore such power semiconductor modules have terminal elements for external load and auxiliary contacts. Some power semiconductor modules also have connecting elements for connections on the inside of the power semiconductor module. According to the state of the art, full surface contact flush type connections, mainly in the form of soldered joints, but also glued joints, are known.

The related also art involves power semiconductor modules similar to those noted in German patent disclosure DE 39 37 045 A1 or non prior published DE 10 2004 019 568 A1. German patent disclosure DE 39 37 045 A1 discloses a power semiconductor module in the form of a half bridge circuit arrangement.

As discussed in the reference, the external load terminal elements for the two direct current connections and for the alternating current connection in this particular power semiconductor module are provided in the form of two-dimensional metal pieces. These metal pieces in the form of connecting bands are arranged in close proximity to each other in order to reduce parasitic inductivity on the inside of the module. Due to the band-type embodiment for reducing parasitic inductivity, these connecting bands have several "foot points" to provide contact with the strip conductors of the substrate. Detrimentally to compact circuit design, these foot points are arranged at a distance with regard to each other that is greater than their lateral dimension.

German patent disclosure DE 10 2004 019 568 A1 shows a similar embodiment of the terminal elements of a power semiconductor module. Here, the surrounding areas of the foot points of the terminal elements have a plurality of indentations in the printed circuit board of the substrate in order to accommodate excess amounts of solder or sloppy solder results. In this disclosure, the foot point of the terminal element is a two-dimensional part of the terminal element in the form of a metal piece with the face being arranged in parallel with regard to the substrate.

Unfortunately, according to the above publications that embody the related art, the substrates of such power semiconductors are insulating substrates comprised of an insulating body as carrier material and for purposes of electric insulation with regard to a base plate or heat sink.

According to the related art, this insulating body is comprised of industrial ceramics such as aluminum oxide or aluminum nitrite. On this insulating body, on the "first-main" face pointing away from the base plate or heat sink, a plurality of connecting tracks is arranged, electrically insulated from each other. The power semiconductor components in turn are arranged on them.

In most cases the insulating body, on the "second-main" face facing the base plate or the heat sink, also has a metal layer of the same material and same thickness as the connecting tracks on the first-main face. Usually, however, this layer is not structured in itself since it is used for the soldered connection to the base plate. The connecting tracks as well as the metal layer of the second main face preferably are comprised of copper that is applied based on the direct copper bonding DCB method.

Connecting elements are arranged to connect the strip conductors to the power semiconductor components with the connecting elements, and are comprised of metal pieces or wire bond connections according to the related art.

Furthermore, terminal elements, also in the form of metal pieces, are arranged in a flush manner on these connecting tracks to provide external electrical connections for the power semiconductor module. Preferably, the terminal elements, as well as the connecting elements in the form of metal pieces, are made of copper since copper has especially advantageous electric properties. In addition, these metal pieces connecting elements and terminal elements may have a tin or silver layer on their faces to improve the soldering properties.

As a substantial detriment in the related art, flush mounting connections between the connecting tracks of the substrate and terminal or connecting elements are subject to mechanical stress. This mechanical stress originates in the temperature stress of the power semiconductor module. This type of power semiconductor module is subject to operating temperatures that range between −40° C. and +90° C., for example.

The material used, in this case copper, determines the thermal coefficient of expansion of both the terminal and connecting elements. However, the characteristics of the insulating body substantively determine the thermal coefficient of the substrate. The thermal stress of the power semiconductor module and the substrate's thermal coefficient of expansion are considerably lower when compared to the thermal coefficient of expansion for the terminal and connecting elements. This substantive difference causes mechanical stress at the connecting point between substrate and the terminal and/or connecting element and is a principal cause of connection failure resulting in breakage of the flush mounting connection.

Other examples of related art flush terminal and/or connecting elements are disclosed in German publications DE 35 05 086 A1, DE 44 46 527 A1, and DE 101 03 084 A1. Unfortunately, upon review these publications fail to provide any additional information with regard to the embodiment of such a flush terminal or connecting element in a manner provided by the present invention. These references only depict differing embodiments of the course and the foot points of the terminal elements.

What is not appreciated by the prior art is the need for an improved flush connection mounting design with increased reliability and service life without expanding a mount area, and while maintaining the scope and spirit of the presently known flush mounting manufacturing techniques of soldering, gluing, and others know to those of skill in the semiconductor module manufacturing arts.

Accordingly, there is a need for an improved design that accommodates the mechanical and thermal stresses associated with flush connections in power semiconductor modules in a convenient manner that does not detrimentally require substantive change in presently known manufacturing method.

OBJECTS AND SUMMARY OF THE INVENTION

An object of the present invention is to provide an improved design and embodiment that overcomes the detriments and responds to the needs noted herein.

Another object of the present invention is to provide a method for flush mounting terminal elements adaptable to soldered joints, glued joints, and other common types of flush mount connections.

Another object of the present invention is to provide a flush connection between a terminal and/or connecting element and a connecting track of a substrate and/or a power semiconductor component in which the terminal and/or connecting element is suitably arranged with regard to the connecting track or the power semiconductor component and mechanical stress is effectively reduced in this flush connection.

Another object of the present invention is to provide a solution to the detriments noted above is based on a power semiconductor module with a base plate or for direct mounting on a heat sink. It is envisioned that the power semiconductor module has at least the following components: a housing, terminal elements for load and auxiliary connections, a substrate with strip conductors, power semiconductor components and at least one connecting element.

The present invention also provides a design wherein terminal elements for load and auxiliary contacts extend from the housing and serve as electric connections for the components arranged on the inside of the housing. The electrically insulating substrate provided with regard to the base plate or heat sink is comprised of an insulating body, preferably industrial ceramics, and a plurality of metal connecting tracks, electrically insulated from each other, are arranged on the first main face facing away from the base plate or the heat sink. The present invention also provides that power semiconductor components are preferably, but not mandated, in arrangements on the connecting tracks and are connected to connecting tracks and/or additional power semiconductor components and/or terminal elements via appropriate circuitry known by those of skill in the art.

The present invention also provides additional internal connecting elements that connect at least two connecting tracks with each other or with power semiconductor components.

Another object of the present invention is to provide a power semiconductor module wherein at least one of the terminal and/or connecting elements is a metal piece with at least one contact face to the connecting tracks and is arranged in an obtuse manner with regard to these connecting tracks. This at least one contact face is divided into a plurality of partial contact faces and each partial contact face has a maximum area of approximately 20 mm$^2$ with two respective partial contact faces being arranged at a maximum distance of approximately 5 mm with regard to each other.

Additionally, the present invention envisions that the connection of the partial contact faces to the connecting tracks and/or power semiconductor components is flush and soldered, even where the terminal element is a bent face.

Another object of the present invention is to provide a power semiconductor module wherein the at least one continuous contact face is divided into a plurality of partial contact faces and each partial contact face has a maximum area of preferably no more than 15 mm$^2$ with two respective partial contact faces being arranged at a maximum distance of approximately 3 mm with regard to each other.

The present invention provides the advantage of designing the terminal and connecting elements wherein the mechanical stress is distributed to at least both partial faces. It is provided that this division of stresses to differing flush mounting plains increases the service life of the power semiconductor module despite thermal stress. It is envisioned that this benefit is especially useful when using the commonly desired lead-free solder, which usually has lower ductility than solder that contains lead, between the terminal or connection element and the connecting track. Thus, this design accommodates the need to reduce mechanical stress and has a long service life.

In brief summary, the present invention relates to a power semiconductor module with a housing, terminal elements leading to the outside of the housing, an electrically insulated substrate arranged inside the housing, with the substrate being comprised of an insulating body and having on the first main face facing away from the base plate a plurality of connecting tracks electrically insulated from each other.

Located on the connecting tracks are power semiconductor components and connecting elements arranged between two connecting tracks and/or between connecting tracks and power semiconductor components. The terminal and connecting elements are metal pieces arranged on the connecting track in an obtuse manner with contact faces to these connecting tracks or to power semiconductor components, with the individual contact faces being a plurality of partial contact faces.

Each partial contact face has a maximum area of 20 mm$^2$, two partial contact faces each are arranged at a distance of 5 mm with regard to each other and the connection of the partial faces to the connecting tracks or the power semiconductor components is flush.

According to an embodiment of the present invention there is provided a power semiconductor module, comprising: at least one of a base plate and a housing for a direct mounting of the power semiconductor module proximate a heat sink element, at least one terminal element leading from the power semiconductor module to an external load contact, at least one electrically insulating substrate in the power semiconductor module, the insulating substrate, further comprising: at least an insulating body, a plurality of connection tracks on a first main face of the insulating body away from the at least one of the base plate and the heat sink, at least one of a power semiconductor component and a connecting element arranged on at least one of the connection tracts on the insulating substrate, the connecting element joining between at least one connection tract and at least one of a second connection track and the at least one power semiconductor component, at least one flush-mount contact face on at least one of the terminal element and the connecting element, the at least one contact face being a plurality of partial contact faces, wherein each partial contact face has a maximum area of substantially 20 mm², and respective ones of each the partial contact face being arranged at a distance of 1 mm<X<6 mm with regard to each other, and wherein the connection of each the partial contact face to the one of connecting tracks and the power semiconductor component is a flush mounting.

According to another embodiment of the present invention there is provided a power semiconductor module, wherein: at least one of the terminal element and the connecting element is a metal piece including a copper portion and a contact surface, and the contact surface including at least one of a tin surface composition and a silver surface composition for improved electrical connection during an assembly of the module.

According to another embodiment of the present invention there is provided a power semiconductor module, wherein: the respective ones of each the partial faces being arranged at a distance of substantially 5 mm from each other.

According to another embodiment of the present invention there is provided a power semiconductor module, further comprising: at least one recess between the respective partial contact faces on the ones of the terminal element and the connecting element, and the at least one recess being substantially angular in shape and positioned approximate a base of the contact surface, whereby the at least one recess improves a connection strength of the element during an assembly of the module.

According to another embodiment of the present invention there is provided a power semiconductor module, further comprising: at least one recess between the respective partial contact faces on the ones of the terminal element and the connecting element, and the at least one recess being formed as a slot extending away from the contact surface.

According to another embodiment of the present invention there is provided a power semiconductor module, further comprising: at least one contraction slot proximate one of the contact faces on the at least one of the terminal and the connecting element.

According to another embodiment of the present invention there is provided a power semiconductor module, further comprising: means for increasing a strain relief proximate a fixed joining region between the one of the flush-mounted contact face and the at least one of the terminal element and the connecting element and, and the means for increasing a strain relief including at least two slot contraction elements arranged proximate to each other.

According to another embodiment of the present invention there is provided a power semiconductor module, comprising: at least one of a terminal element and a connecting element, at least one of the elements having a flush-mounting contact face in a flush-mounting end region thereof, the flush-mounting end region adapted for flush mounting the contact face on a flush-mounting connection region of at least one of a semiconductor component and an electrical connection track member on an electrically insulating member, and means for reducing strain at a flush mounting of the contact face in the flush-mounting end region of the at least one element to the at least one of the semiconductor component and the electrical connection track member, whereby the means for reduced-strain flush mounting minimizing a flush mounting strain in the flush-mounting end region proximate the contact face thereby increasing a service life and a reliability of the power semiconductor module.

According to another embodiment of the present invention there is provided a power semiconductor module, further comprising: at least one of a means for minimizing a torsional stress and a means for managing thermal transfer stress in the means for reducing strain, whereby, the means for reducing includes at least one recess proximate the flush-mounting end region of the at least one element, and the at least one recess forming the flush-mounting contact face into at least two partial flush-mounting contact faces of the at least one element, thereby enabling an improved connection.

According to another embodiment of the present invention there is provided a power semiconductor module, wherein: the means for reduced-strain flush mounting further comprises: at least one recess on the flush flush-mounting end region of the at least one element, whereby the at least one recess divides the end region into a plurality of partial contact faces.

According to another embodiment of the present invention there is provided a power semiconductor module, wherein: the at least one recess is one of a triangular shape and a slot shape functioning as a stress break between sides of the element, and each the shape extending away from the flush mounting contact region whereby strain applied proximate the contact region and the end region is divided between each the partial contact face.

According to another embodiment of the present invention there is provided a power semiconductor module, further comprising: at least one contraction region on the at least one element spaced from the flush mounting contact region, and each the contraction region including at least one recesses extending partially through a portion of the at least one element proximate the flush mounting contract region, whereby a torsional stress operating along the at least one element preferably affects the element proximate the at least one contraction region spaced from the flush mounting contract region, thereby minimizing a stress on the contact face and improving an operational reliability of the power semiconductor module.

According to another embodiment of the present invention there is provided a power semiconductor module, further comprising: at least a second recess in the contraction region of the at least one element extending along a substantially opposing direction relative to a first the recess and generally orthogonal to the flush mounting contact region, whereby the at least two recesses in the contraction region form a means for enabling a rotational stress reduction of the element, thereby minimizing rotational stress applied to the partial contact faces.

According to another embodiment of the present invention there is provided a power semiconductor module, wherein: the at least one element has an outer dimension, and the at least one recess forms the partial contact faces on the flush-mounting contact face of the element for the improved connection within a space defined by the outer dimension, whereby the partial contact faces have a contact area that is less than a contact area of the at least one element without the at least one recess.

According to another embodiment of the present invention there is provided a method for manufacturing a power semiconductor module, comprising the steps of: preparing at least one insulating substrate, the insulating substrate including a plurality of conducting tracts on a first main face of the insulating body positioned away from at least one support surface for the module, providing at least one of a power semiconductor component, a connecting element, and a terminal element on the at least one of the plurality of conducting tract on the insulating substrate, providing at least one flush-mounting end on at least one of the connecting element and the terminal element, the at least one flush-mounting end positionable for enabling at least one flush-mounting connection to at least one flush-mount connection region on at least one of the power semiconductor component and one of the plurality of the conducting tracts, forming at least one recess on the one flush-mounting end, thereby forming a plurality of partial contact faces on the flush-mounting end of the at least one of the connecting element and the terminal element, the at least one of the connecting element and the terminal element having an outer dimension, the at least one recess forming the partial contact faces on the flush-mounting contact face of the element within a space defined by the outer dimension, whereby the partial contact faces have a contact area that is less than a contact area of the at least one element without the at least one recess, and positioning the plurality of partial contact faces on the flush-mount connection region and flush mounting the at least one of the connecting element and the terminal element, whereby the at least one recess and the partial contact faces enables an improved reliability of the power semiconductor module.

According to another embodiment of the present invention there is provided a method for manufacturing a power semiconductor module, further comprising the steps of: forming the at least one recess in the form of a slot extending away from the flush-mounting end, whereby during the step of positioning and flush mounting a portion of the slot remains unfilled by a solder or an adhesive, thereby improving a reliability of the power semiconductor module.

According to another embodiment of the present invention there is provided a method for manufacturing a power semiconductor module, further comprising the steps of: forming at least one concentration opening on the element distant from the flush-mounting end and away from the at least one recess prior to the steps of positioning and flush mounting, whereby the at least one concentration opening enables a narrowing of a cross-section of the element proximate the concentration opening thereby urging a stress concentration distant from the flush-mounting end and the at least one recess.

According to another embodiment of the present invention there is provided a method for manufacturing a power semiconductor module, wherein the step of: forming the at least one recess on the flush-mounting end, spaces each the partial contact face from the other a distance Z, the distance Z being between 1.0 mm to 7.00 mm, and each the partial contact face has a maximum area of 20 mm$^2$.

According to another embodiment of the present invention there is provided a method for manufacturing a power semiconductor module, wherein the step of: forming at least one concentration opening on a side region of the element, further comprises the step of: forming the at least one concentration opening in the shape of at least one of a side-slot, a side recess, and angular opening, and a through hole, whereby the at least one concentration opening enables the narrowing of the cross-section of the element without a dependence upon a particular opening geometry.

According to another embodiment of the present invention there is provided a method for manufacturing a power semiconductor module, wherein the step of: forming at least one recess on the one flush-mounting end, further comprises the step of: forming at least one side edge of the at least one element in a relieved chamfered manner thereby minimizing the partial contact face and enabling an increased surface area for bonding during the step of positioning and flush mounting.

The above, and other objects, features and advantages of the present invention will become apparent from the following description read in conduction with the accompanying drawings, in which like reference numerals designate the same elements.

DETAILED DESCRIPTION OF THE PREFERRED EMBODIMENTS

Figure 1:
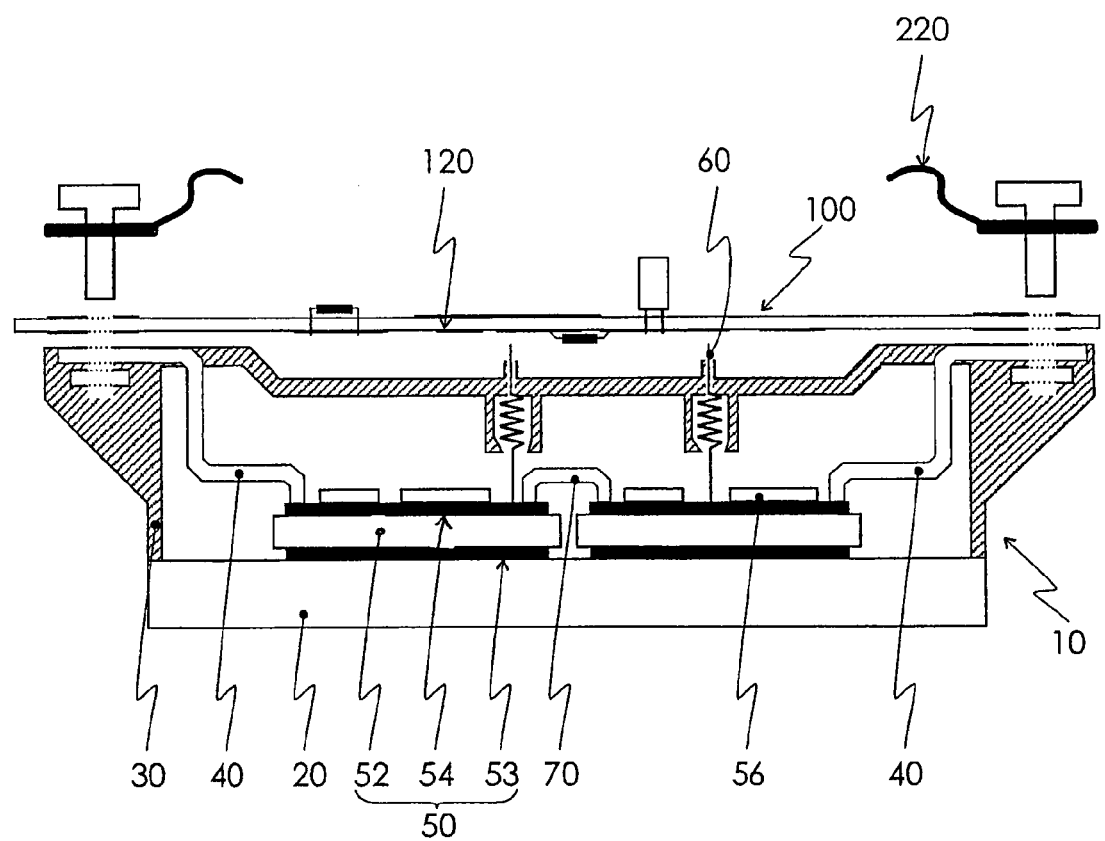
FIG. 1 shows a power semiconductor module with terminal elements arranged in an obtuse manner.

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale. For purposes of convenience and clarity only, directional terms, such as top, bottom, up, down, over, above, and below may be used with respect to the drawings. These and similar directional terms should not be construed to limit the scope of the invention in any manner. The words "connect," "couple," and similar terms with their inflectional morphemes do not necessarily denote direct and immediate connections, but also include connections through mediate elements or devices.

Referring now to FIG. 1 a power semiconductor module 10 with a printed circuit board 100 is provided with terminal elements 40 arranged in an obtuse manner. Printed circuit board 100 and the power semiconductor module 10 are arranged at a narrow distance from each other. Power semiconductor module 10 is supported on a base plate 20. Arranged on base plate 20 are a frame-like housing 30 as well as two substrates 50, 50.

Each substrate 50 includes an insulating body 52 as well as metallizations arranged on both main faces (a first main face on top and a second main face on the bottom). The metallization 53 that faces base plate 20 is two-dimensional and not structured and is shown as a continuous band. The metallization facing the inside (first main face) of power semiconductor module 10, is structured in itself and thus provides the structured various strip conductors 54 of the substrate, as will be shown.

Arranged on strip conductors 54 are power semiconductor components 56. The electrical load is provided by terminal elements 40 and auxiliary contacts 60. Auxiliary contacts 60 are provided in the form of contact springs and provide an elastic urging or pressurization to enable a secure electrical connection between the strip conductors 54 of the substrate 50 and one or more corresponding strip conductors 120 on an underside of printed circuit board 100.

Terminal elements 40 of the power connection are provided in the form of metal pieces that have a recess for a screwed connection at one end and are soldered at their other end to respective strip conductor 54 of the substrate 50 in an obtuse or orthogonal manner.

Housing 30 provides a frame, and a cover portion has extending shapes for positioning and fixing load terminal element 40 and auxiliary contacts 60. The power connections are fixed in an extending shape of housing 30.

Printed circuit board 100 has strip conductors 120 on the side facing power semiconductor module 10. Strip conductors 120 provide the contact points of contact springs in auxiliary contacts 60 and thus provide secure connection to strip conductors 54 of the substrate 50. Connecting elements join strip conductors 54 as will be discussed.

Cable connections 220 connect terminal elements of power connections 40 to the intermediate direct current circuit, and the load in this case.

Figure 2A:
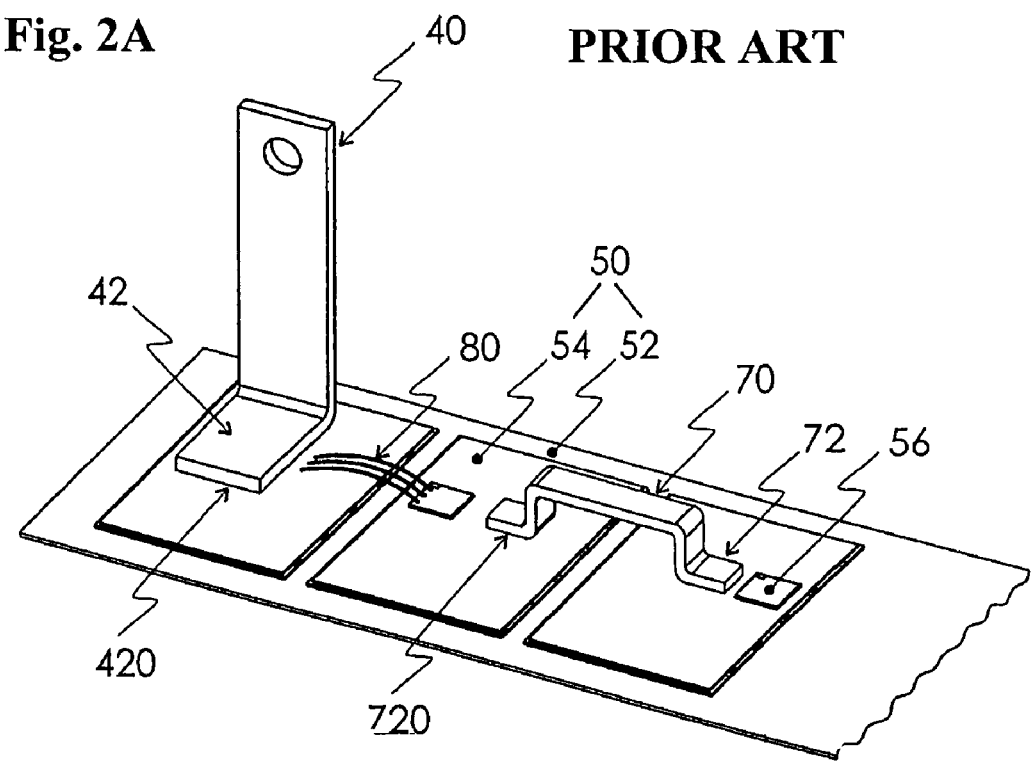
FIGS. 2A and 2B show conventional substrates with terminal and connecting elements.

Referring now to FIG. 2A, a related art design shows a substrate 50 with terminal 40 (shown bent in a right angle for contact) and connecting elements 70. As before, strip conductors 54 are supported on insulating body 52 of the substrate 50. On each of two of the strip conductors 54 a power semiconductor component 56 is arranged. As an example, one power semiconductor component 56 is connected to an adjacent strip conductor 54 by means of a wire bond connecting element 80.

In this example, terminal element 40 is arranged on strip conductor 54 as a bent metal piece having a section 42 parallel to substrate 50 that provides a flush contact face 420 to respectively substrate 50 or connecting track 54. Face 420 is connected in a flush manner with strip conductors 54 by means of a soldered connection (not shown). A connecting element 70 connects two strip conductors 54. Connecting element 70 in the form of a bent metal piece has respective sections 72 parallel to the substrate 50 at connecting points. These connection points are contact faces 720 contacting strip conductors 54. In a similar embodiment connecting elements 70 between a strip conductor 54 and a power semiconductor component have been known for a long time. As noted earlier, an alternative variation for connection is provided by means of wire bond connection 80, as shown.

Figure 2B:
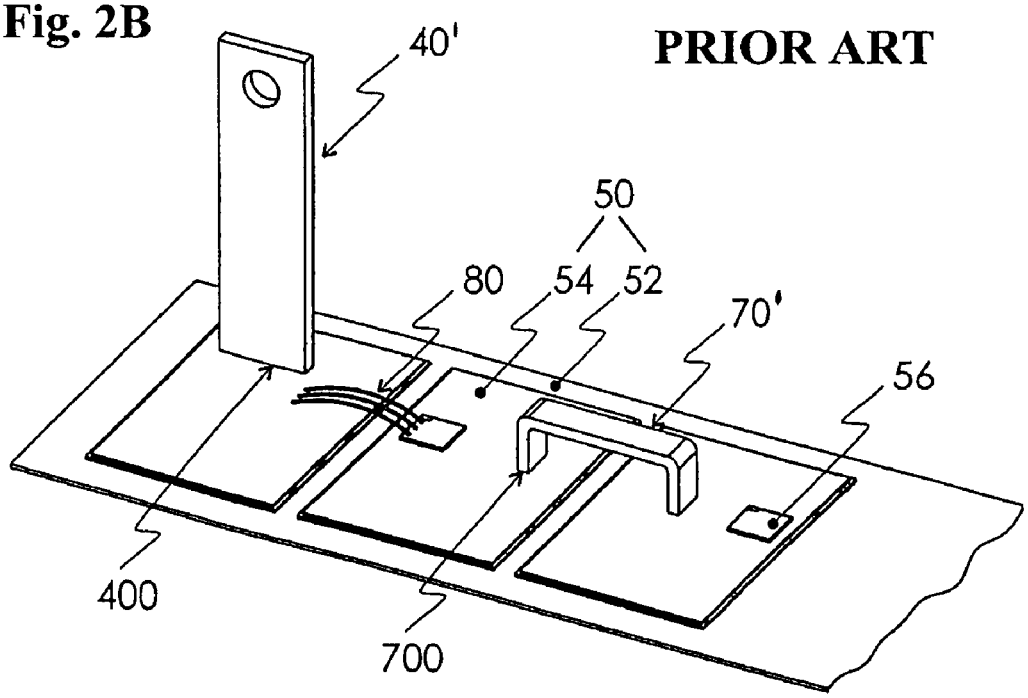

Referring now to FIG. 2B, a similar conventional arrangement is shown using the same components in differing forms as discussed. In contrast to FIG. 2A, here a terminal element 40' and a connecting element 70' do not have any portions or sections parallel to substrate 50 other than their flush contact faces. As shown, terminal 40' and connecting elements 70' are soldered in an obtuse (only orthogonal shown) manner onto connecting tracks 54 by means of respective contact faces 400, 700. As used herein, those of skill in the art will recognize that the "obtuse manner" for contacting elements 40' or 70' to substrate 54 is shown in a generally orthogonal manner projecting away from substrate 50.

Figure 3:
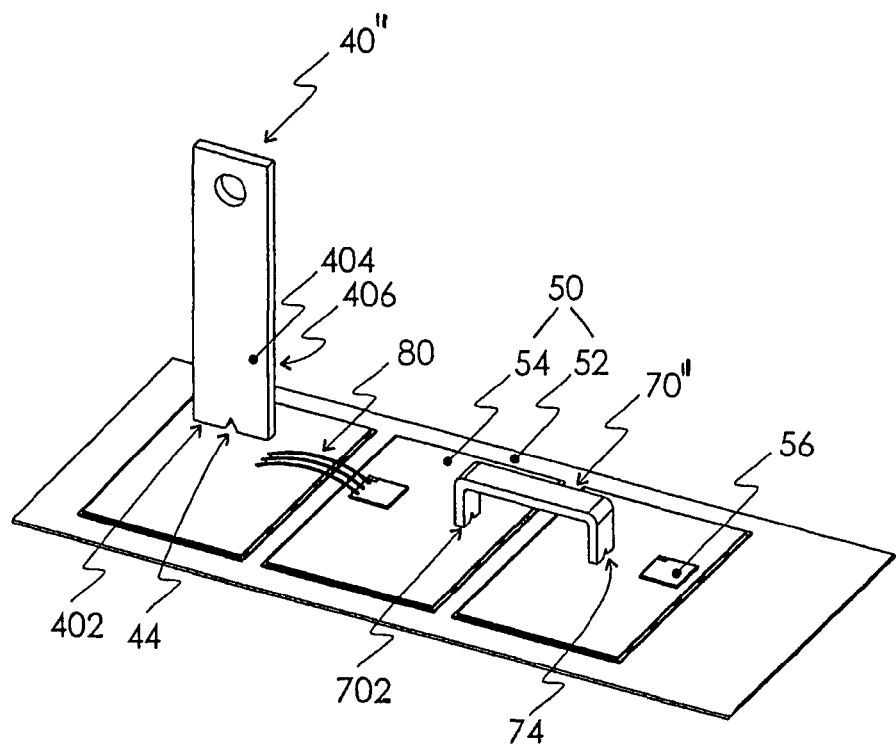
FIG. 3 shows a substrate with terminal and connecting elements according to one embodiment of the invention.

Referring now to FIG. 3, a substrate 50 includes a terminal 40" and connecting elements 70"; according to the present invention. Main components, such as substrate 50 and power semiconductor components 56 are as discussed above. While elements 40" and 70" closely resemble respective elements 40', 70' in FIG. 2B, the present discussion also references the invention discussed to similar elements 40, 70 in FIG. 2A. However, contrary to the conventional arts, FIG. 3 depicts a further development of terminal 40" and connecting elements 70".

As in the related arts, terminal element 40" also is soldered in a generally obtuse (reasonably perpendicular—but any angle is allowed by this method) manner onto connecting track 54. However, in the present invention the flush contact face between terminal element 40" and connecting track 54 is not a continuous face but rather is comprised of at least two partial contact faces 402, shown as a stress management or stress compensation device partial contact faces.

To this end, the metal piece of terminal element 40" has at least one recess 44, as shown. Recess 44 extends away from the face of the metal piece facing substrate 50, and as shown here extends in a triangular shape from a first main face 404 to a second main face 406 of terminal element 40".

As noted later, the area of each partial face 402 is smaller than about 20 mm$^2$, and the distance of the partial faces 402, 402 with regard to each other ranges between 1 mm and 5 mm. One benefit of the present invention is that the flush connection between strip conductor 54 and terminal element 40" is a soldered connection and the solder extends therefore into and within receiving recess 44 and thus fills it almost completely or completely providing a secure and reliable connection capable of withstanding substantive stress and thermal cycling.

Similarly the contact faces for connecting element 70" are also divided into two partial contact faces 702, each having a triangular shaped recess 74.

Additionally referring now to FIGS. 4A-4D, examples of alternative embodiment of parts of terminal 40" or connecting elements 70" are discussed.

Figures 4A, 4B, 4C, 4D:
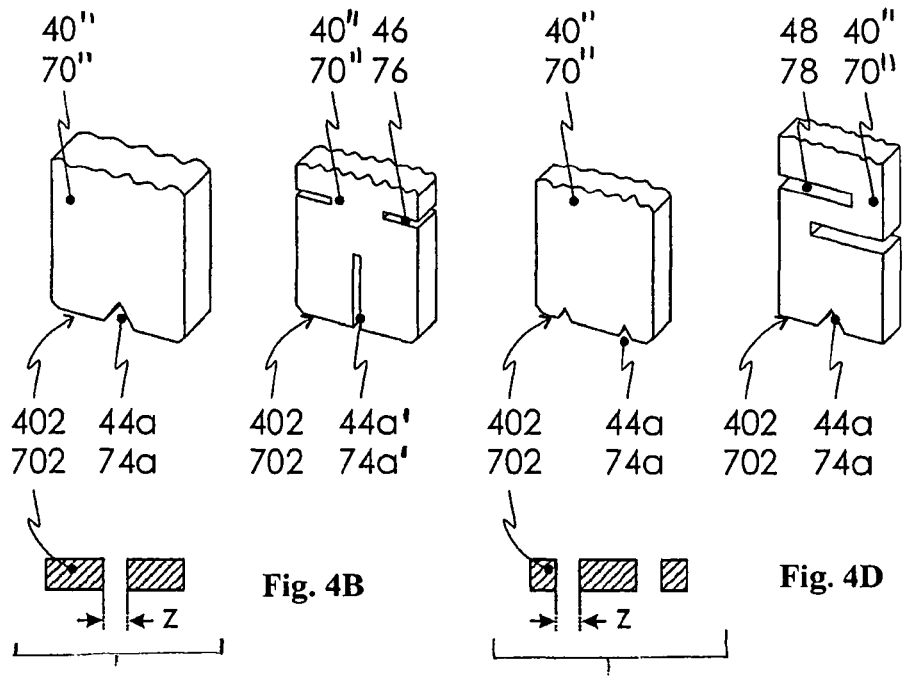
FIGS. 4A-D provide alternative embodiments of terminal and connecting elements.

FIG. 4A shows an alternative embodiment of a recess 44a wherein however, the outer narrow side edges are also phased out or slanted or recessed in an otherwise chamfered manner creating a slight recess relative to the overall outer shape of terminal 40" or element 70" to improve solder connection and stress reduction. Furthermore, a face or a top view of individual partial contact faces 402, 702 shows the chamfered or phased out recessed edges, as well as the distance between contact faces 402, 702 being roughly 1 mm$\leq$z$\leq$5 mm.

FIG. 4B shows an alternative slot-type embodiment of the recess 44a', 74a' of terminal 40" or connecting element 70" respectively. In this embodiment, slots 44a', 74a' extend as recesses, vertically away from the flush contact face and form resultant partial contact faces. In contrast with FIG. 4A, slot 44a', 74a' is advantageously not completely filled with solder when applying the soldered connection, due to it's length away from the contact faces. This openness allows the connection regions of terminal 40" or connecting element 70" to additionally shift and adjust to thermal stress without breaking or weakening the solder bond. As a result, in addition to the discussion above this is yet another method for reducing or managing stress and reducing a failure risk.

As shown, the metal end piece of terminal 40" or element 70" has multiple stress concentration regions or concentration or contraction slots 46, 76 at a distance from the contact face/partial contact faces in the form of two additional slots (46, 76) positioned generally perpendicularly to the first slot 44a', 74a'. As a result of slots 46, 76, this design operates to accommodate torsional forces by flexing at the narrowed waist-region (stress concentrator region) formed by the slots 46, 76 without passing this torsion stress along the length of terminal 40" or element 70" to the partial contact faces, and thereby further managing applied stress at the flush mounted faces.

Referring now to FIG. 4C another alternative embodiment of the present invention provides an flush face end region of terminal 40" or connecting element 70" respectively with two recesses 44a, 74a extending between front and back faces 404, 406. A plurality (not shown) of such recesses 44a, 74a of varying sizes may be arrayed along the contact faces and further reduces mechanical stress while simultaneously improving bonding. However, a minimal area of the partial face of 4 mm$^2$ is advantageous as well for adherence. A top view of the individual partial contact faces 402, 702 as well as the distance Z between them of approximately 1 mm$\leq$z$\leq$5 mm is shown.

In FIG. 4D, another alternative embodiment provides terminal 40" or connecting element 70" respectively with two or more overlapping slots arranged at a distance from each other and at a defined distance from the contact face with the slots forming two concentration or contractions 48, 78 (and a circuitous pathway) and serving as strain relief "contracting" region (both tension, torsional, and compressive) proximate the flush mounted partial contact faces. The use of the phrase contracting here does not require a change in distance, and is a label for the region collectively and each slot contraction respectively.

As will be apparent to those of skill in the art, the embodiments noted above may be readily adjusted to the much larger contact face of designs noted in element 40 and connecting element 70 where a plurality of recess may extend along the contact faces for bonding and soldering connection, and recesses 44a, 74a or 46, 76 may be provided for further strain reduction. It should be additionally appreciated that the recesses discussed herein (forming partial contact faces) for flush mounting additionally operate to increase a contact or a bonding surface area for gripping solder or adhesive during assembly, thereby improving a connection reliability.

As will also be apparent to those of skill in the art the present disclosure envisions and provides alternative embodiments of strain reduction designs at the flush mounting or partial contact faces not contemplated in the related art. These embodiments include designs that increase the flush mounting bond by increasing solder/adhesive contact and that operate to focus torsional and other strains away from the flush mounting region along a length of each element thereby shifting strain away from the flush-mounting joint. As a consequence, the present invention presents a power semiconductor module design that allows a manufacturer to select a particular strain reduction design most suitable for the strain conditions power semiconductor. As a consequence, flush mounting design may be maintained and utilized in power semiconductor elements under a wider range of stress/strain conditions without departing from common manufacturing understandings.

As will also be understood by those of skill in the art, for convenience terminal element 40 and connecting element 70 may be generally referred to as connecting elements, or simply as elements.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

The invention claimed is:

1. A power semiconductor module with a base plate, or for the purpose of direct assembly on a heat sink at least consisting of a housing, contact elements leading outwards for external load contacts, at least one electrically insulating substrate arranged within the housing, which in turn consists of an insulator body and a plurality of metallic connection tracks that are electrically insulated from each other and located on its first main surface facing away from the base plate or heat sink, power semiconductor components and connecting elements located thereon, and between two connection tracks and/or between connection tracks and power semiconductor components, wherein at least one contact element and/or connecting element is constructed as a metallic shaped part with at least one end section, wherein each end section extends perpendicularly to an associated connection track and is butt soldered with at least one contact surface to this connecting track, wherein this contact surface is constructed as a plurality of partial contact surfaces wherein each partial contact surface has a maximum surface area of 20 mm$^2$, and each pair of partial contact areas has a maximum separation of 5 mm from each other, wherein the end section of the contact element and/or connecting element includes in its extent two constrictions closely neighboring the contact surfaces and arranged a small distance apart, which are formed from two overlapping slits spaced apart from each other and wherein the structure with these constrictions and slits provides strain relief for said contact element and/or connecting element.

2. The power semiconductor module according to claim 1, wherein the contact element and/or connecting element are constructed as metallic shaped parts made of copper with a surface made of tin or silver.

3. The power semiconductor module according to claim 1, wherein the partial contact surfaces are spaced apart from each other by a distance of 1 mm to 5 mm.

4. The power semiconductor module according to claim 3, wherein the contact element and/or connecting element has recesses between the partial contact surfaces, which are in the shape of a triangle with the base on the contact surface.

5. The power semiconductor module according to claim 3, wherein the contact element and/or connecting element has recesses between the partial contact surfaces, which extend in the form of slits perpendicularly away from the contact surface.

* * * * *